(12) United States Patent
Tanikawa

(10) Patent No.: US 10,284,184 B2
(45) Date of Patent: May 7, 2019

(54) BOOSTER CIRCUIT

(71) Applicant: LAPIS Semiconductor Co., Ltd., Yokohama (JP)

(72) Inventor: Hiroyuki Tanikawa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/498,441

(22) Filed: Apr. 26, 2017

(65) Prior Publication Data

US 2017/0317584 A1  Nov. 2, 2017

(30) Foreign Application Priority Data

Apr. 28, 2016 (JP) ................................. 2016-090372

(51) Int. Cl.
| | |
|---|---|
| G05F 5/00 | (2006.01) |
| H02M 3/07 | (2006.01) |
| G06F 1/08 | (2006.01) |
| G05F 1/10 | (2006.01) |
| H02M 3/18 | (2006.01) |
| H03K 5/1252 | (2006.01) |

(52) U.S. Cl.
CPC .......... *H03K 5/1252* (2013.01); *H02M 3/073* (2013.01); *H02M 2003/075* (2013.01)

(58) Field of Classification Search
CPC ................ H03K 5/1252; H02M 3/073; H02M 2003/075
USPC .............. 327/148, 157, 534–537; 363/59, 60
See application file for complete search history.

(56) References Cited

U.S. PATENT DOCUMENTS

| | | | | |
|---|---|---|---|---|
| 5,546,031 A | * | 8/1996 | Seesink | G11C 16/30 327/155 |
| 2005/0151580 A1 | * | 7/2005 | Lin | H02M 3/073 327/536 |
| 2006/0176040 A1 | * | 8/2006 | Kernahan | G06F 1/3203 323/299 |
| 2009/0237049 A1 | * | 9/2009 | Hachiya | H02M 3/156 323/282 |
| 2011/0043175 A1 | * | 2/2011 | Sohma | H02M 3/156 323/282 |
| 2012/0007682 A1 | * | 1/2012 | Huang | H03L 7/0995 331/34 |
| 2014/0300409 A1 | * | 10/2014 | Emira | H02M 3/073 327/536 |
| 2015/0015323 A1 | * | 1/2015 | Rahman | H02M 3/073 327/536 |

(Continued)

FOREIGN PATENT DOCUMENTS

JP  2003-249076 A  9/2003

*Primary Examiner* — Brandon S Cole
(74) *Attorney, Agent, or Firm* — Rabin & Berdo, P.C.

(57) ABSTRACT

A charge pump unit including a capacitor that accumulates a charge on an output node according to a first clock signal and a transfer gate that takes in and applies a voltage of an input node to the output node according to a second clock signal received at a control terminal is controlled in the following manner. If the ratio of the total time of periods in which the voltage of the output node is higher than a target voltage in a predetermined monitoring period is smaller than or equal to a first threshold, i.e., if the charge pump unit executes a boosting operation for a relatively long period, a pulse voltage value of the second clock signal is increased.

13 Claims, 13 Drawing Sheets

(56) References Cited

U.S. PATENT DOCUMENTS

| | | | |
|---|---|---|---|
| 2016/0103466 A1* | 4/2016 | Yamamoto | H03B 5/26 331/47 |
| 2016/0247458 A1* | 8/2016 | Muto | G09G 3/344 |

* cited by examiner

BOOSTER CIRCUIT

BACKGROUND OF THE INVENTION

1. Field of the Invention

The present invention relates to a booster circuit, and more particularly to a booster circuit which boosts a power supply voltage in a semiconductor device.

2. Description of the Related Art

Semiconductor devices such as a nonvolatile semiconductor memory need a high voltage (several volts to 20 volts) as a write voltage for writing data. A nonvolatile semiconductor memory then generates a write voltage to be applied to memory cells by boosting a relatively-low power supply voltage supplied from outside by using a booster circuit such as a charge pump circuit.

A charge pump circuit including a capacitor and a transfer gate has been known. The capacitor charges and discharges an electric charge. The transfer gate repeats an operation of transferring the charge generated by the capacitor to the output line and an operation of stopping the transfer, thereby boosting the voltage on the output line (for example, see Japanese Patent Application Laid-Open No. 2003-249076).

A metal oxide semiconductor (MOS) transistor having a low threshold voltage is employed as the transfer gate used in such a charge pump circuit, in consideration of an increase in the threshold voltage due to a body effect during boosting.

If the threshold voltage of the transfer gate shifts to higher voltages due to manufacturing variations, etc., the transfer period of the charge by the transfer gate may decrease. In such a case, the period until the boosted voltage reaches a desired voltage value increases, and the operation period of the charge pump circuit needs to be increased accordingly. This causes a problem of increased power consumption. If the threshold voltage of the transfer gate shifts to lower voltages, the boosting speed may become too fast. This can cause a problem of ringing of the boosted voltage about the desired voltage value.

SUMMARY OF THE INVENTION

An object of the present invention is to provide a booster circuit that can generate a boosted voltage of which ringing is suppressed, without causing an increase in power consumption.

According to one aspect of the present invention, a booster circuit includes: a charge pump unit that boosts an input voltage applied to an input node to generate a boosted voltage and outputs the boosted voltage to an output node; and a control unit that controls an operation of the charge pump unit. The charge pump unit includes a capacitor that accumulates a charge on the output node according to a first clock signal, and a transfer gate that takes in and applies a voltage of the input node to the output node according to a second clock signal received at a control terminal. The control unit includes a clock voltage adjustment unit that increases a pulse voltage value of the second clock signal if a ratio of a total time of periods in which the boosted voltage is higher than a target voltage in a predetermined monitoring period is smaller than or equal to a first threshold.

According to another aspect of the present invention, a booster circuit includes: a charge pump unit that includes first to n-th (n is an integer greater than or equal to 2) charge pump circuits connected in series, the charge pump circuits each including an input node and an output node and boosting an input voltage applied to its own input node to generate a boosted voltage on its own output node; and a control unit that controls an operation of the charge pump unit. The first to n-th charge pump circuits each include a capacitor that accumulates a charge on its own output node according to a first clock signal, and a transfer gate that takes in and applies a voltage of its own input node to its own output node according to a second clock signal received at a gate terminal. The control unit includes a clock voltage adjustment unit that increases a pulse voltage value of the second clock signal if a ratio of a total time of periods in which the boosted voltage on the output node of the n-th charge pump circuit is higher than a target voltage in a predetermined monitoring period is smaller than or equal to a first threshold.

According to the present invention, the charge pump unit including the capacitor that accumulates a charge on the output node according to the first clock signal and the transfer gate that takes in and applies the voltage of the input node to the output node according to the second clock signal received at the control terminal is controlled in the following manner. If the ratio of the total time of periods in which the voltage of the output node is higher than the target voltage in the predetermined monitoring period is smaller than or equal to the first threshold, i.e., if the charge pump unit executes a boosting operation for a relatively long period, the pulse voltage value of the second clock signal is increased.

As the pulse voltage value of the second clock signal increases, the ON resistance of the transfer gate decreases. Even if the threshold voltage of the transfer gate shifts to higher voltages due to manufacturing variations, an increase in the execution period of the boosting operation by the charge pump unit can thus be suppressed. This allows a reduction in power consumption. The transfer gate has a high ON resistance immediately before the pulse voltage value of the second clock signal is increased. This suppresses the boosting speed of the charge pump unit. Even if the threshold voltage of the transfer gate shifts to lower voltages due to manufacturing variations, a favorable boosted voltage of which ringing is suppressed can thus be generated.

DETAILED DESCRIPTION OF THE INVENTION

An embodiment of the present invention will be described in detail below with reference to the drawings.

Figure 1:
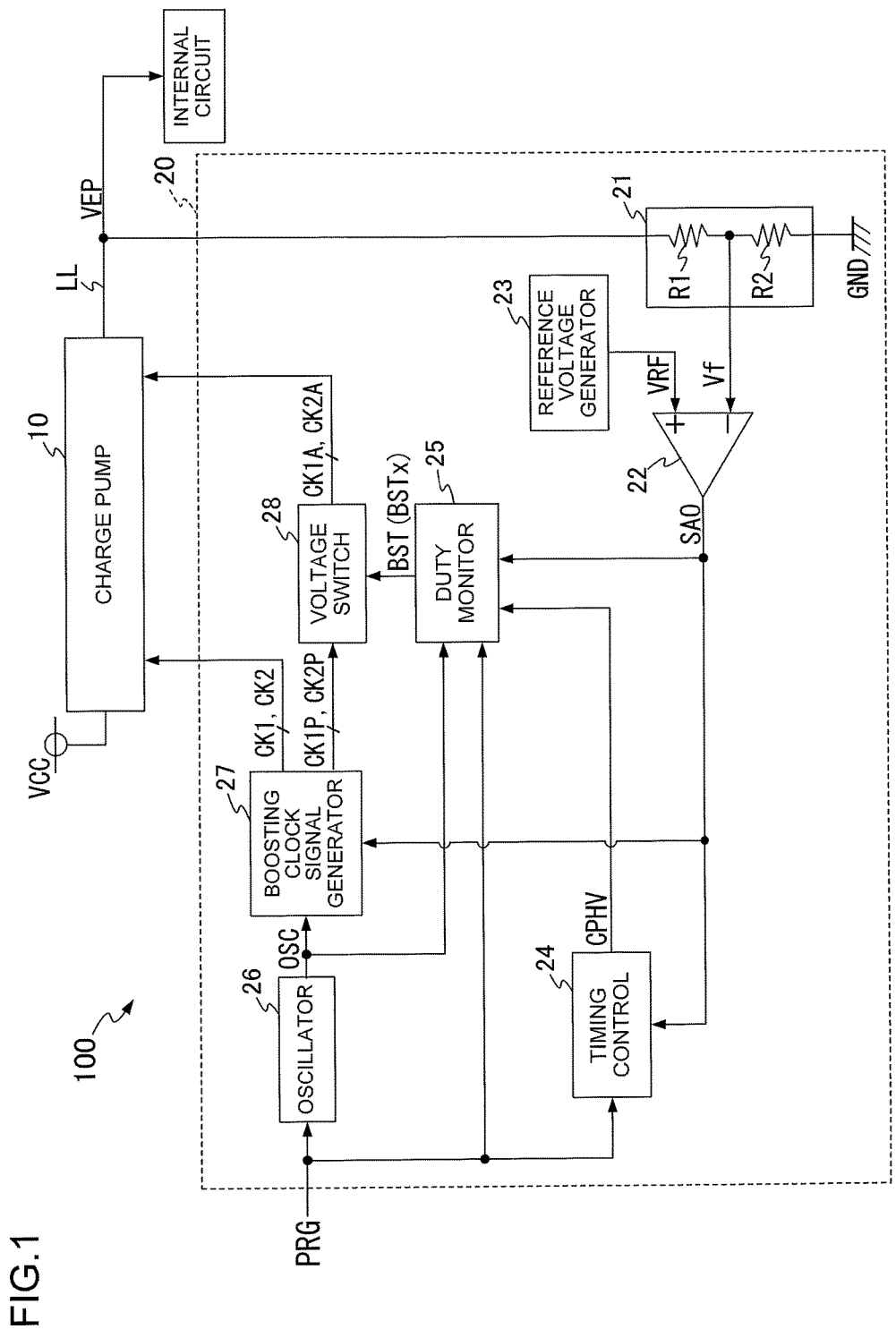
FIG. 1 is a block diagram showing a configuration of a booster circuit 100 according to the present invention.
Figure 2:
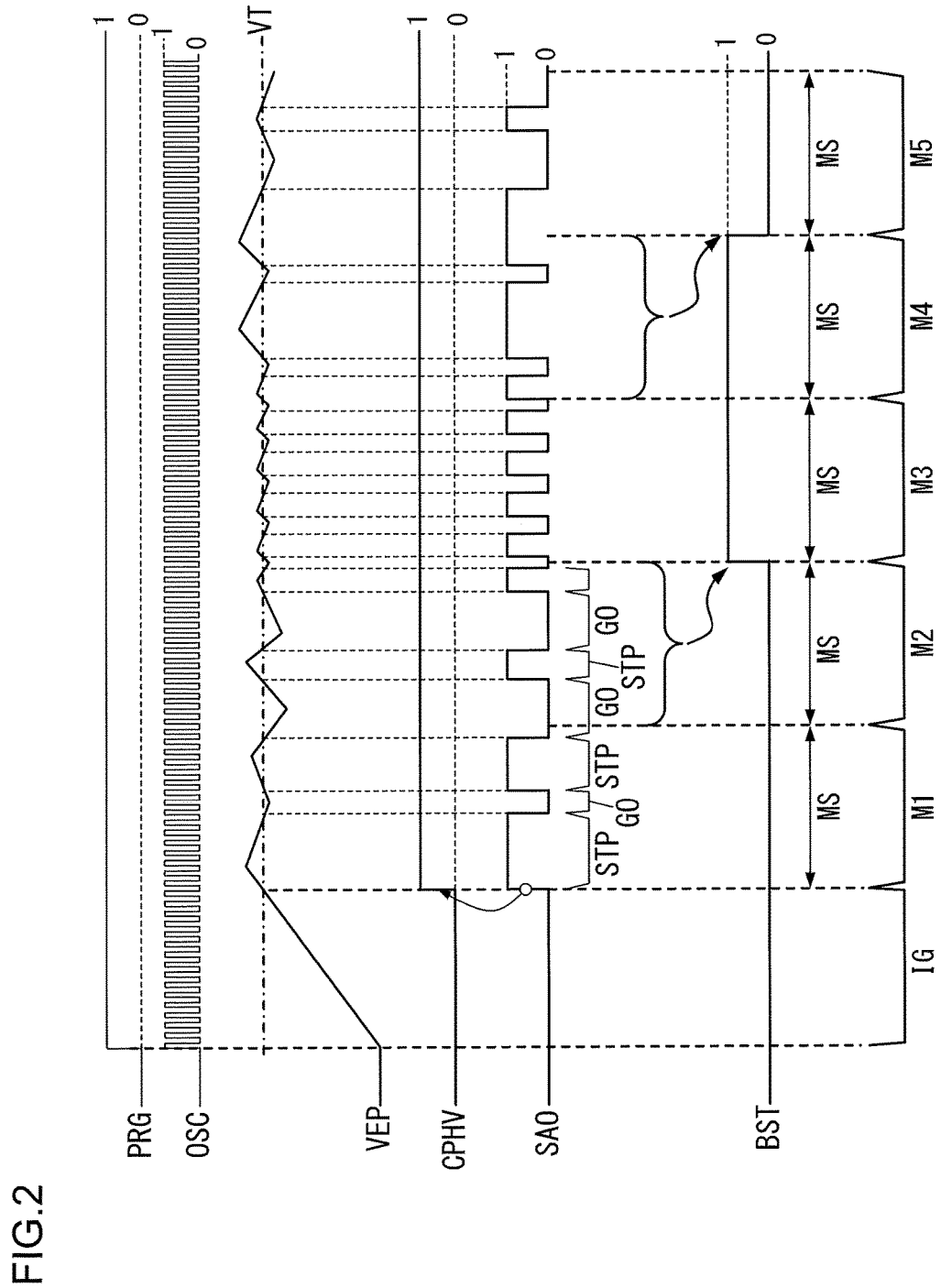
FIG. 2 is a timing chart showing an example of an internal operation of the booster circuit 100.

FIG. 1 is a block diagram showing a configuration of a booster circuit 100 according to the embodiment of the present invention. FIG. 2 is a timing chart showing an example of an internal operation of the booster circuit 100.

The booster circuit 100 is formed in a semiconductor IC chip. The booster circuit 100 boosts a power supply voltage VCC to generate a boosted voltage VEP, and outputs the boosted voltage VEP to a power supply line LL. An internal circuit which receives and operates on the power supply voltage (VEP) from the power supply line LL is connected to the power supply line LL. If, for example, the internal circuit is a nonvolatile semiconductor memory such as a flash memory, the nonvolatile semiconductor memory generates a data write or data erasure voltage on the basis of the boosted voltage VEP, and supplies the data write or data erasure voltage to the source lines or word lines of its memory cells.

As shown in FIG. 1, the booster circuit 100 includes a charge pump unit 10 and a control unit 20. The charge pump unit 10 boosts the power supply voltage VCC to generate the boosted voltage VEP, and applies the boosted voltage VEP to the power supply line LL. The control unit 20 controls the charge pump unit 10.

The control unit 20 includes a voltage dividing resistor 21, a comparator 22, a reference voltage generation circuit 23, a timing control circuit 24, a duty monitoring circuit 25, an oscillation circuit 26, a boosting clock signal generation circuit 27, and a voltage switch circuit 28.

The voltage dividing resistor 21 includes a resistor R1 and a resistor R2. One end of the resistor R1 is connected to the power supply line LL. The other end of the resistor R1 is connected to one end of the resistor R2. A ground voltage GND is applied to the other end of the resistor R2. The voltage dividing resistor 21 divides the voltage of the power supply line LL and supplies the divided voltage as a monitoring voltage Vf to the comparator 22.

The reference voltage generation circuit 23 generates and supplies a reference voltage VRF to the comparator 22. The reference voltage VRF has a voltage value equal to that expected to be obtained if a target voltage VT serving as the target of the voltage value of the boosted voltage VEP is divided by the voltage dividing resistor 21.

The comparator 22 compares the reference voltage VRF and the monitoring voltage Vf in magnitude to determine whether the boosted voltage VEP is higher than the target voltage VT. As shown in FIG. 2, the comparator 22 generates a target voltage achievement signal SAO which has logic level 0 during periods in which the boosted voltage VEP is determined to be lower than or equal to the target voltage VT. The target voltage achievement signal SAO has logic level 1 during periods in which the boosted voltage VEP is determined to be higher than the target voltage VT. The comparator 22 supplies the target voltage achievement signal SAO to the timing control circuit 24, the duty monitoring circuit 25, and the boosting clock signal generation circuit 27.

While a boosting mode signal PRG having logic level 0 for prompting deactivation of the booster circuit 100 is supplied, the timing control circuit 24 generates a boosting control period signal CPHV having logic level 0 which indicates a non-execution period of boosting control. The timing control circuit 24 then determines whether the boosting mode signal PRG transitions from the state of logic level 0 to a state of logic level 1 for prompting activation of the booster circuit 100. If the boosting mode signal PRG is determined to transition to the state of logic level 1, the timing control circuit 24 starts to generate the boosting control period signal CPHV having logic level 1 when the target voltage achievement signal SAO first transitions from logic level 0 to logic level 1 after the transition of the boosting mode signal PRG. Logic level 1 of the boosting control period signal CPHV indicates an execution period of boosting control. The timing generation circuit 24 supplies the boosting control period signal CPHV to the duty monitoring circuit 25.

The oscillation circuit 26 performs an oscillation operation while the boosting mode signal PRG having logic level 1 for prompting activation is supplied. As shown in FIG. 2, the oscillation circuit 26 thereby generates a reference clock signal OSC having a predetermined oscillation frequency. The oscillation circuit 26 stops the oscillation operation while the boosting mode signal PRG having logic level 0 for prompting deactivation is supplied. During such a period, as shown in FIG. 2, the oscillation circuit 26 generates the reference clock signal OSC having a fixed logic level of 0. The oscillation circuit 26 supplies the reference clock signal OSC to the duty monitoring circuit 25 and the boosting clock signal generation circuit 27.

Figure 3:
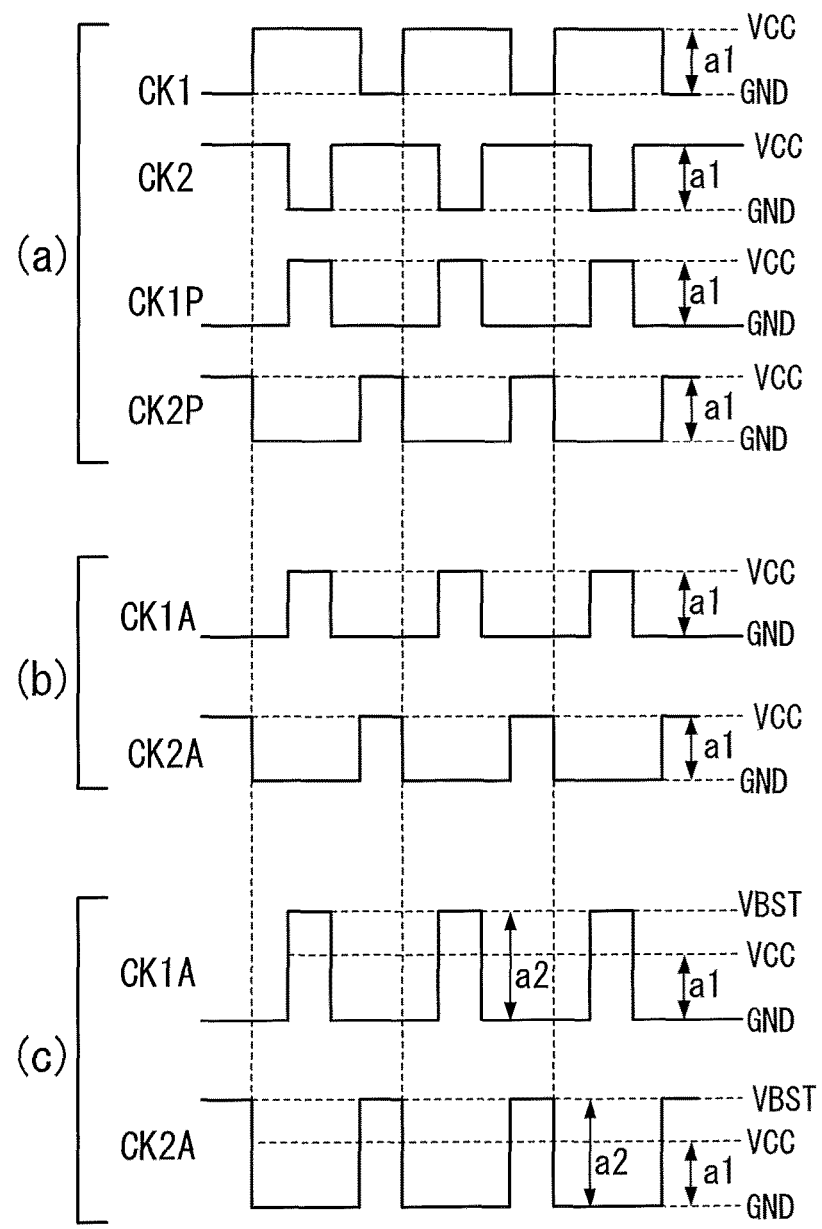
FIG. 3 is a waveform chart showing examples of waveforms of capacitor clock signals CK1 and CK2 and gate clock signals CK1A and CK2A.

The boosting clock signal generation circuit 27 generates capacitor clock signals CK1 and CK2 and gate clock signals CK1P and CK2P shown in (a) of FIG. 3 on the basis of the reference clock signal OSC while the target voltage achievement signal SAO having logic level 0 is supplied. Logic level 0 of the target voltage achievement signal SAO indicates that the boosted voltage VEP is lower than or equal to the target voltage VT. The capacitor clock signals CK1 and CK2 and the gate clock signals CK1P and CK2P are clock signals having the same frequency. The clock signals have a pulse voltage value of a1, with the power supply voltage VCC as the maximum peak voltage and the ground voltage GND as the minimum peak voltage. The capacitor clock signals CK1 and CK2 differ in the phase of rising and falling edges. The capacitor clock signal CK1 and the gate clock signal CK2P have opposite phases. The capacitor clock signal CK2 and the gate clock signal CK1P have opposite phases. The boosting clock signal generation circuit 27 supplies the capacitor clock signals CK1 and CK2 to the charge pump unit 10, and the gate clock signals CK1P and CK2P to the voltage switch circuit 28.

The boosting clock signal generation circuit 27 stops supplying the foregoing clock signals (CK1, CK2, CK1P, and CK2P) to the charge pump unit 10 and the voltage switch circuit 28 during the target voltage achievement signal SAO having logic level 1, which indicates that the boosted voltage VEP is higher than the target voltage VT, is supplied.

Figure 4:
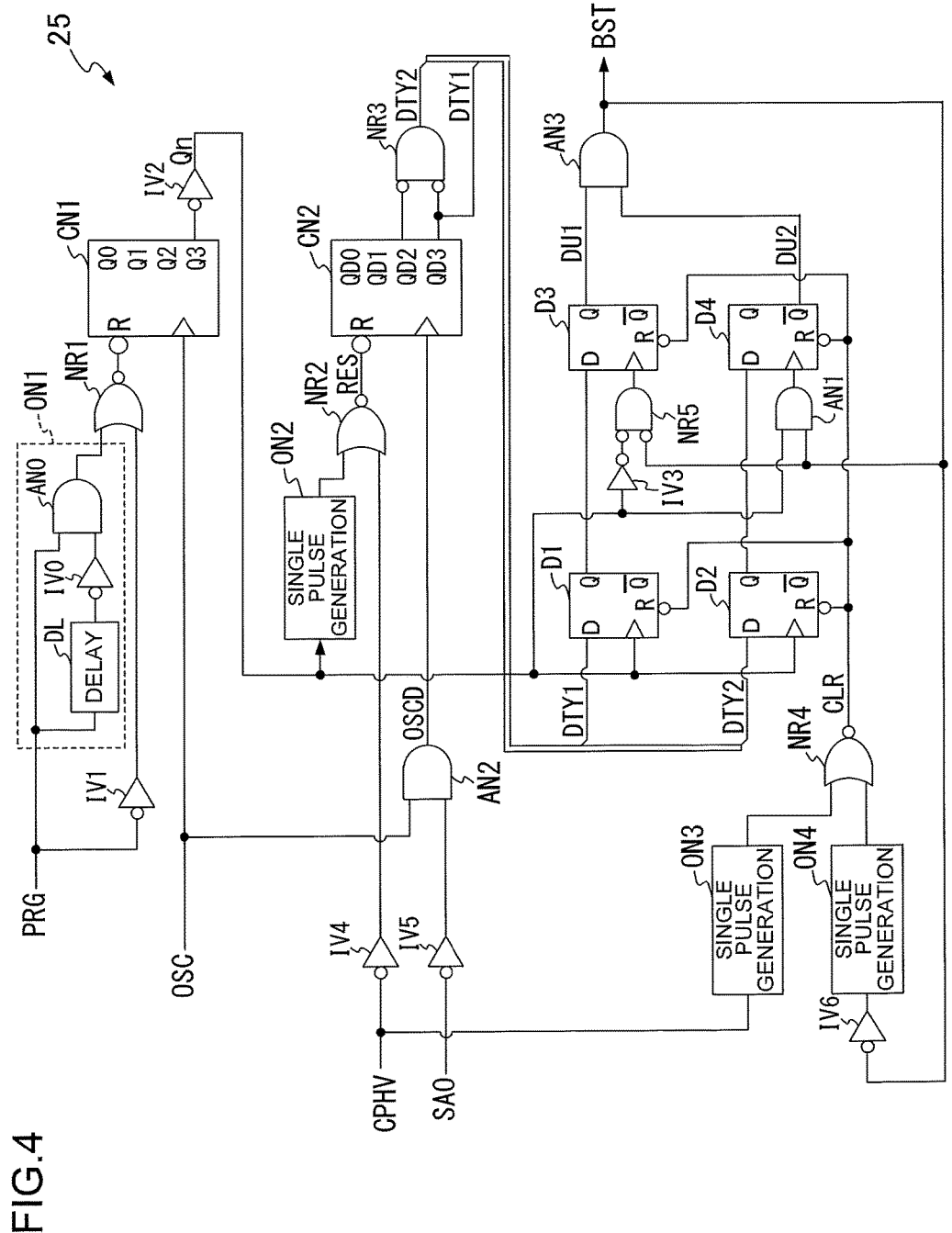
FIG. 4 is a circuit diagram showing a circuit configuration of a duty monitoring circuit 25.
Figure 5:
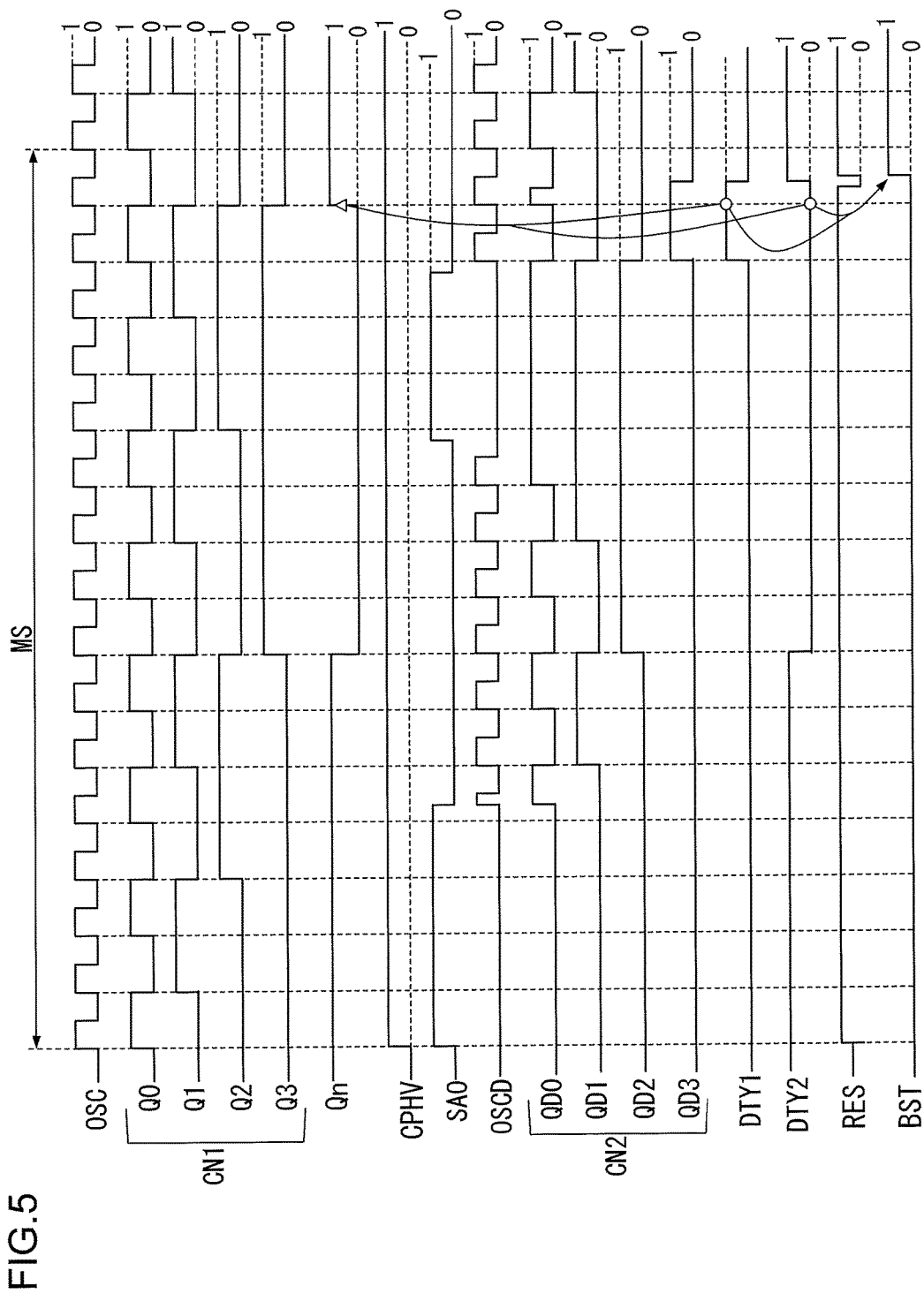
FIG. 5 is a timing chart showing an example of an internal operation of the duty monitoring circuit 25.

FIG. 4 is a circuit diagram showing a circuit configuration of the duty monitoring circuit 25. FIG. 5 is a timing chart showing an example of an internal operation of the duty monitoring circuit 25.

In FIG. 4, a single pulse generation circuit ON1 includes a delay circuit DL, an inverter IV0, and an AND gate AN0. The delay circuit DL outputs a delay signal obtained by delaying an input binary signal (having logic level 0 or 1) by a predetermined period to the inverter IV0. The inverter IV0 supplies an inverted signal obtained by inverting the logic level of the delay signal to the AND gate AN0. The AND gate AN0 outputs a signal indicating the logical AND result of the inverted signal and the signal input to the delay circuit DL as a single pulse signal. The circuit including the delay circuit DL, the inverter IV0, and the AND gate AN0 generates a single pulse signal that has logic level 1 only in a predetermined period when the input signal transitions from the state of logic level 1 to the state of logic level 0. In other periods, the single pulse signal maintains the state of logic level 0.

With such a configuration, the single pulse generation circuit ON1 generates a reset signal of pulse form. The reset signal enters the state of logic level 1 only during a predetermined period from when the boosting mode signal PRG transitions from the state of logic level 0 to logic level 1 as shown in FIG. 2. In other periods, the reset signal has logic level 0. The single pulse generation circuit ON1 supplies the reset signal to a NOR gate NR1. An inverter IV1 supplies a signal obtained by inverting the logic level of the boosting mode signal PRG to the NOR gate NR1 as a reset signal. The NOR gate NR1 supplies a reset signal having logic level 0 for prompting resetting of a counter to a reset terminal R of a counter CN1 only if a reset signal having logic level 1 is supplied from the inverter IV1 or the single pulse generation circuit ON1.

An example of the counter CN1 is a hexadecimal counter. The counter CN1 counts the number of pulses of the reference clock signal OSC and outputs the count value as four count bits Q0 to Q3. If the reset signal having logic level 0 is supplied to its reset terminal R, the counter CN1 initializes its count value to 0, or equivalently, the values of the count bits Q0 to 3 to "0000." If the reset signal transitions to logic level 1, the counter CN1 then continues to count the number of pulses of the reference clock signal OSC. If the count value reaches the maximum value expressed in four bits, i.e., "1111," the counter CN1 restores the count value to "0000" in response to the next pulse of the reference clock signal OSC, and continues to count the pulses of the reference clock signal OSC. The period in which the count value of the counter CN1 changes from "0000" to "1111" is the monitoring period MS shown in FIG. 2. Among the count bits Q0 to Q3, the count bit Q0 is the least significant bit (LSB), and the count bit Q3 is the most significant bit (MSB).

An inverter IV2 supplies an inverted MSB count bit Qn obtained by inverting the logic level of the count bit Q3, which is the most significant bit of the counter CN1, to a single pulse generation circuit ON2, an inverter IV3, and an AND gate AN1. The inverter IV2 further supplies the inverted MSB count bit Qn to a clock input terminal of each of D flip-flops D1 and D2.

The single pulse generation circuit ON2 includes circuits similar to those of the single pulse generation circuit ON1 (i.e., DL, IV0, and AN0). The single pulse generation circuit ON2 generates a reset signal of pulse form. The reset signal enters the state of logic level 1 only during a predetermined period from when the inverted MSB count bit Qn transitions from the state of logic level 0 to logic level 1. In other periods, the reset signal has logic level 0. The single pulse generation circuit ON2 supplies the reset signal to a NOR gate NR2. An inverter IV4 supplies a signal obtained by inverting the logic level of the boosting control period signal CPHV to the NOR gate NR2 as a reset signal. The NOR gate NR2 supplies a reset signal RES having logic level 0 for prompting resetting of a counter to a reset terminal R of a counter CN2 only when a reset signal having logic level 1 is supplied from the inverter IV4 or the single pulse generation circuit ON2.

An inverter IV5 supplies an inverted target voltage achievement signal obtained by inverting the logic level of the target voltage achievement signal SAO to an AND gate AN2.

The AND gate AN2 supplies the reference clock signal OSC as a reference clock signal OSCD to a clock terminal of the counter CN2 only while the inverted target voltage achievement signal is in the state of logic level 1. In other words, as shown in FIG. 2, the AND gate AN2 supplies the reference clock signal OSC as the reference clock signal OSCD to the clock terminal of the counter CN2 only when the target voltage achievement signal SAO is in the state of logic level 0.

An example of the counter CN2 is a hexadecimal counter. The counter CN2 counts the number of pulses of the reference clock signal OSCD, and outputs the count value as four count bits QD0 to QD3. If the reset signal RES having logic level 0 is supplied to its reset terminal R, the counter CN2 initializes its count value to 0, i.e., the values of the count bits QDb 0 to QD3 to "0000." If the reset signal transitions to logic level 1, the counter CN2 then continues to count the number of pulses of the reference clock signal OSCD. If the count value reaches the maximum value expressed in four bits, i.e., "1111," the counter CN2 restores the count value to "0000" in response to the next pulse of the reference clock signal OSCD, and continues to count the pulses of the reference clock signal OSCD. Among the count bits QD0 to QD3, the count bit QD0 is the least significant bit (LSB) and the count bit QD3 is the most significant bit (MSB).

The counter CN2 supplies a first duty signal DTY1 having the same logic level as that of the count bit QD3 to an input terminal D of the D flip-flop D1.

A NOR gate NR3 generates a second duty signal DTY2. The second duty signal DTY2 has logic level 1 only when both the count bits QD2 and QD3 of the counter CN2 have logic level 0. The second duty signal DTY2 has logic level 0 when at least either one of the count bits QD2 and QD3 has logic level 1. The NOR gate NR3 supplies the second duty signal DTY2 to an input terminal D of the D flip-flop D2.

A single pulse generation circuit ON3 includes circuits similar to those of the single pulse generation circuit ON1 (i.e. DL, IV0, and AN0). The single pulse generation circuit ON3 generates a reset signal of pulse form. The reset signal has logic level 1 only during a predetermined period from when the boosting control period signal CPHV transitions from logic level 0 to logic level 1. In other periods, the reset signal has logic level 0. The single pulse generation circuit ON3 supplies the reset signal to a NOR gate NR4.

An inverter IV6 supplies an inverted voltage switch signal to a single pulse generation circuit ON4. The inverted voltage switch signal is obtained by inverting the logic level of a voltage switch signal BST which serves as an output signal of the duty monitoring circuit 25.

The single pulse generation circuit ON4 includes circuits similar to those of the single pulse generation circuit ON1 (i.e. DL, IV0, and AN0). The single pulse generation circuit ON4 generates a reset signal of pulse form. The reset signal has logic level 1 only during a predetermined period from when the inverted voltage switch signal transitions from logic level 0 to logic level 1. In other periods, the reset signal has logic level 0. The single pulse generation circuit ON4 supplies the reset signal to the NOR gate NR4.

The NOR gate NR4 supplies a reset signal CLR having logic level 0 for prompting resetting of a D flip-flop to a reset terminal R of each of the D flip-flops D1 to D4 only when a reset signal having logic level 1 is supplied from the single pulse generation circuit ON3 or ON4.

The D flip-flop D1 latches and holds the first duty signal DTY1 at the timing of a rising edge of the inverted MSB count bit Qn, i.e., at the timing of transition from logic level 0 to logic level 1. The D flip-flop D1 supplies the latched and held first duty signal DTY1 to an input terminal D of the D flip-flop D3 at the next stage.

The inverter IV3 and a NOR gate NR5 supply the inverted MSB count bit Qn, i.e., the signal obtained by inverting the logic level of the count bit Q3 of the counter CN1 to a clock input terminal of the D flip-flop D3 only while the voltage switch signal BST is in the state of logic level 0.

The D flip-flops D3 latches and holds the first duty signal DTY1 supplied from the D flip-flop D1 at the timing of the rising edge of the inverted MSB count bit Qn only while the voltage switch signal BST is in the state of logic level 0. The D flip-flop D3 supplies the latched and held first duty signal DTY1 as a first monitoring duty signal DU1 to an AND gate AN3.

The D flip-flop D2 latches and holds the second duty signal DTY2 at the timing of the rising edge of the inverted MSB count bit Qn. The D flip-flop D2 supplies the latched and held second duty signal DTY2 to an input terminal D of the D flip-flop D4 at the next stage.

The AND gate AN1 supplies the inverted MSB count bit Qn to a clock input terminal of the D flip-flop D4 only while the voltage switch signal BST has logic level 1.

The D flip-flops D4 latches and holds the second duty signal DTY2 supplied from the D flip-flop D2 at the timing of the rising edge of the inverted MSB count bit Qn only while the voltage switch signal BST is in the state of logic level 0. The D flip-flop D4 supplies a signal obtained by inverting the logic level of the latched and held second duty signal DTY2 to the AND gate AN3 as a second monitoring duty signal DU2.

The D flip-flops D1 to D4 reset the contents held therein to the state of logic level 0 according to the reset signal CLR having logic level 0 supplied from the NOR gate NR4.

The AND gate AN3 generates the voltage switch signal BST having logic level 1 only when the first monitoring duty signal DU1 and the second monitoring duty signal DU2 both have logic level 1. Logic level 1 of the voltage switch signal BST specifies a second pulse voltage value a2 as the pulse voltage value of the gate clock signals. When at least either one of the first and second monitoring duty signals DU1 and DU2 has logic level 0, the AND gate AN3 generates the voltage switch signal BST having logic level 0. Logic level 0 of the voltage switch signal BST specifies a first pulse voltage value a1 as the pulse voltage value of the gate clock signals. The AND gate AN3 supplies the voltage switch signal BST to the voltage switch circuit 28.

With the foregoing configuration, the duty monitoring circuit 25 initially determines the first and second duty signals DTY1 and DTY2 in each monitoring period MS shown in FIG. 2. The monitoring period MS refers to 16 cycles of the clock pulse of the reference clock signal OSC. Specifically, if the total time of periods in which the target voltage achievement signal SAO has logic level 1 in each monitoring period MS is greater than or equal to eight cycles of the pulse of the reference clock signal OSC, the duty monitoring circuit 25 generates the first duty signal DTY1 having logic level 1 as shown in FIG. 5. If the total time of periods in which the target voltage achievement signal SAO has logic level 1 in each monitoring period MS is less than or equal to three cycles of the pulse of the reference clock signal OSC, the duty monitoring circuit 25 generates the second duty signal DTY2 having logic level 1 as shown in FIG. 5.

As shown in FIG. 5, if the boosting control period signal CPHV transitions from logic level 0 to logic level 1, the inverted MSB count bit Qn transitions from logic level 0 to the state of logic level 1 at every 16 cycles of the pulse of the reference clock signal OSC. In other words, a rising edge of the inverted MSB count bit Qn arises at every 16 cycles of the pulse of the reference clock signal OSC. Here, the circuit including the D flip-flops D1 and D3, the inverter IV3, the NOR gate NR4, and the AND gate AN3 shown in FIG. 4 determines whether the first duty signal DTY1 has logic level 1. If the first duty signal DTY1 is determined to have logic level 1, the circuit switches the voltage switch signal BST from logic level 0 to logic level 1. The circuit including the D flip-flops D2 and D4 and the AND gates AN1 and AN3 then determines whether the second duty signal DTY2 has logic level 1. If the second duty signal DTY2 is determined to have logic level 1, the circuit switches the voltage switch signal BST to logic level 0 and resets the D flip-flops D1 to D4.

With the foregoing configuration, the duty monitoring circuit 25 generates the voltage switch signal BST having logic level 0 for specifying the foregoing pulse voltage value a1 as the pulse voltage value of the gate clock signals while the boosting mode signal PRG is in the state of logic level 0. Subsequently, if the boosting mode signal PRG transitions from logic level 0 to logic level 1, the duty monitoring circuit 25 performs the following operation during a period when the boosting control period signal CPHV has logic level 1 which indicates a period in which boosting control is in operation.

The duty monitoring circuit 25 initially measures, as shown in FIG. 2, the total time of periods in which the target voltage achievement signal SAO has logic level 1 and the total time of periods in which the target voltage achievement signal SAO has logic level 0 in each monitoring period MS on the basis of the reference clock signal OSC.

The duty monitoring circuit 25 then determines a ratio between the total time of the periods in which the target voltage achievement signal SAO has logic level 1 and the total time of the periods in which the target voltage achievement signal SAO has logic level 0, i.e., a so-called duty ratio in each monitoring period MS. As employed herein, the duty ratio is determined in each monitoring period MS as the ratio of the total time of the periods in which the target voltage achievement signal SAO has logic level 1 in the monitoring period MS. As will be described later, if the target voltage achievement signal SAO has logic level 0, the charge pump unit 10 is activated to perform charge pumping. If the target voltage achievement signal SAO has logic level 0, the charge pump unit 10 is deactivated to stop charge pumping. Hereinafter, the total time of periods in which the target voltage achievement signal SAO has logic level 0 in a monitoring period MS will therefore be referred to as a charge pump execution period. The total time of periods in which the target voltage achievement signal SAO has logic level 1 in a monitoring period MS will be referred to as a charge pump stop period.

Next, the duty monitoring circuit 25 determines, in each monitoring period MS, whether the ratio of the charge pump stop period in the monitoring period MS is smaller than or equal to a first threshold TH1, or greater than or equal to a second threshold TH2 greater than the first threshold TH1. The first threshold TH1 is set at a value indicating a charge pump execution period such that the power consumption of the charge pump unit 10 in the charge pump execution period does not exceed a predetermined allowable amount of power. The second threshold TH2 is set at a value indicating a charge pump execution period such that an overshoot of the boosted voltage VEP falls within a predetermined allowable voltage range.

If the ratio of the charge pump stop period in the monitoring period MS is determined to be smaller than or equal to the first threshold TH1, the duty monitoring circuit 25 switches the voltage switch signal BST from logic level 0 to logic level 1. If the ratio of the charge pump stop period in the monitoring period MS is determined to be greater than or equal to the second threshold TH2, the duty monitoring circuit 25 switches the voltage switch signal BST from logic level 1 to logic level 0.

In each monitoring period MS, if the ratio of the charge pump stop period in that period is smaller than or equal to the first threshold TH1, the duty monitoring circuit 25 switches the voltage switch signal BST from logic level 0 to logic level 1. That is, the duty monitoring circuit 25 switches the voltage switch signal BST from logic level 0 which specifies the first pulse voltage value a1 to logic level 1 which specifies the second pulse voltage value a2 greater than the first pulse voltage value a1.

If the ratio of the charge pump stop period in the monitoring period MS is greater than or equal to the second threshold TH2, the duty monitoring circuit 25 switches the voltage switch signal BST from the state of logic level 1 which specifies the second pulse voltage value a2 to the state of logic level 0 which specifies the first pulse voltage value a1. If the ratio of the charge pump stop period in each monitoring period MS is greater than the first threshold TH1 and smaller than the second threshold TH2, the duty monitoring circuit 25 maintains the state of the voltage switch signal BST immediately before.

The duty monitoring circuit 25 supplies the voltage switch signal BST generated as described above to the voltage switch circuit 28.

Figure 6:
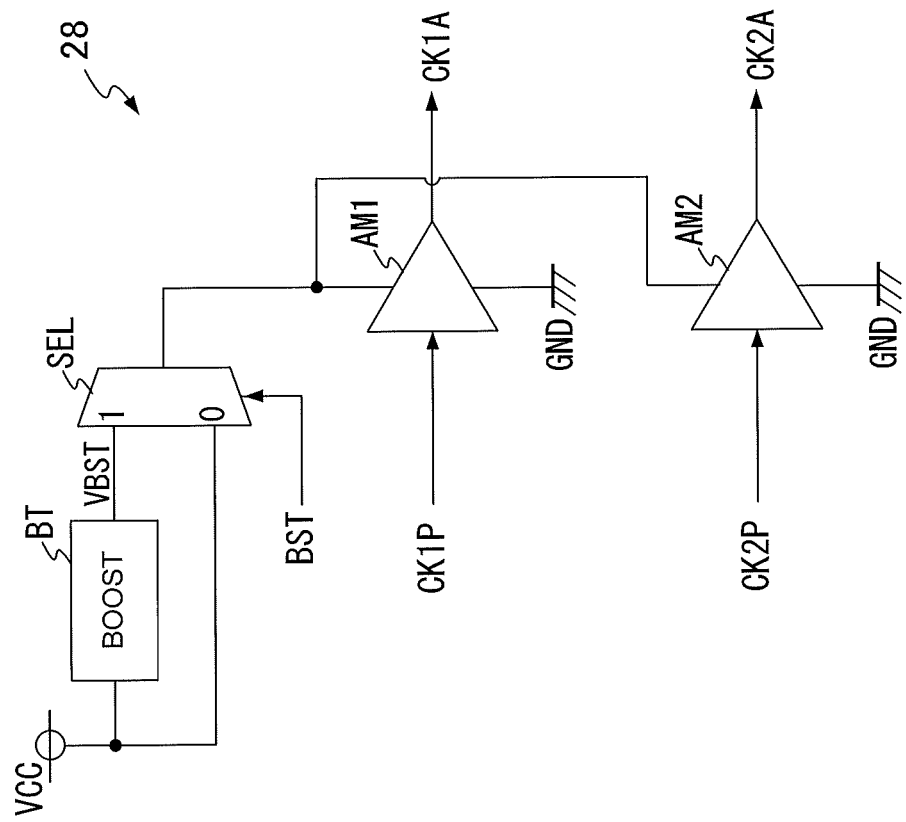
FIG. 6 is a circuit diagram showing an example of an internal configuration of a voltage switch circuit 28.

FIG. 6 is a circuit diagram showing an example of an internal configuration of the voltage switch circuit 28. A boost circuit BT generates a boosted power supply voltage VBST having a voltage higher than the voltage value of the power supply voltage VCC based on the power supply voltage VCC, and supplies the boosted power supply voltage VBST to a selector SEL. If the voltage switching signal BST has logic level 0, the selector SEL supplies the power supply voltage VCC to a power supply terminal of an amplifier AM1. If the voltage switch signal BST has logic level 1, the selector SEL supplies the boosted power supply voltage VBST to the power supply terminal of the amplifier AM1 and that of an amplifier AM2. Examples of the amplifiers AM1 and AM2 are operational amplifiers of voltage follower configuration.

The amplifier AM1 generates a binary signal as a gate clock signal CK1A. During a period in which the gate clock signal CK1P has logic level 0, the gate clock signal CK1A has the ground voltage GND that is applied to the ground terminal of the amplifier AM1. During a period in which the gate clock signal CK1P has logic level 1, the gate clock signal CK1A has the voltage that is applied to the power supply terminal of the amplifier AM1.

The amplifier AM2 generates a binary signal as a gate clock signal CK2A. During a period in which the gate clock signal CK2P has logic level 0, the gate clock signal CK2A has the ground voltage GND that is applied to the ground terminal of the amplifier AM2. During a period in which the gate clock signal CK2P has logic level 1, the gate clock signal CK2A has the voltage that is applied to the power supply terminal of the amplifier AM2.

With the foregoing configuration, if the voltage switch signal BST shows logic level 0, the voltage switch circuit 28 simply generates the gate clock signals CK1P and CK2P supplied from the boosting clock signal generation circuit 27 as the gate clock signals CK1A and CK2A. Here, the voltage switch circuit 28 generates the binary (with logic level 0 or 1) gate clock signals CK1A and CK2A having the pulse voltage value a1 (VCC-GND) as shown in (b) of FIG. 3. If the voltage switch signal BST shows logic level 1, the voltage switch circuit 28 generates the gate clock signals CK1A and CK2A having the voltage value a2 (VBST-GND) greater than the pulse voltage value a1 (VCC-GND) of the gate clock signals CK1P and CK2P as shown in (c) of FIG. 3. The gate clock signals CK1A and CK2A have the same frequency and phase as those of the gate clock signals CK1P and CK2P, respectively. The voltage switch circuit 28 supplies the foregoing gate clock signals CK1A and CK2A to the charge pump unit 10.

Figure 7:
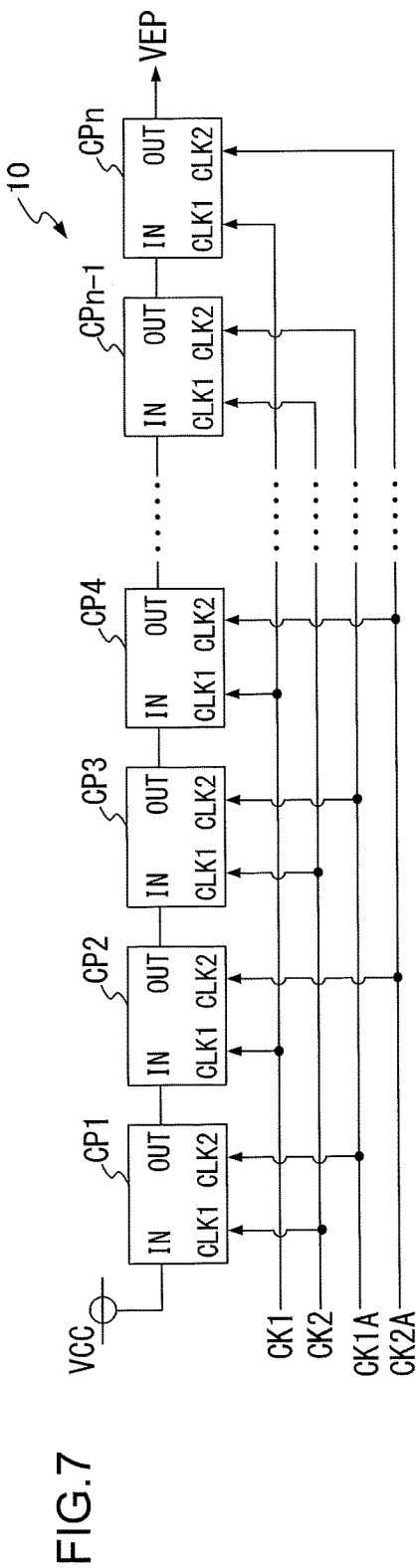
FIG. 7 is a block diagram showing an example of an internal configuration of a charge pump unit 10.

FIG. 7 is a block diagram showing an example of an internal configuration of the charge pump unit 10. As shown in FIG. 7, the charge pump unit 10 includes n charge pump circuits CP1 to CPn connected in series ("n" is an integer greater than or equal to 2). The charge pump circuits CP1 to CPn have the same circuit configuration.

Figure 8:
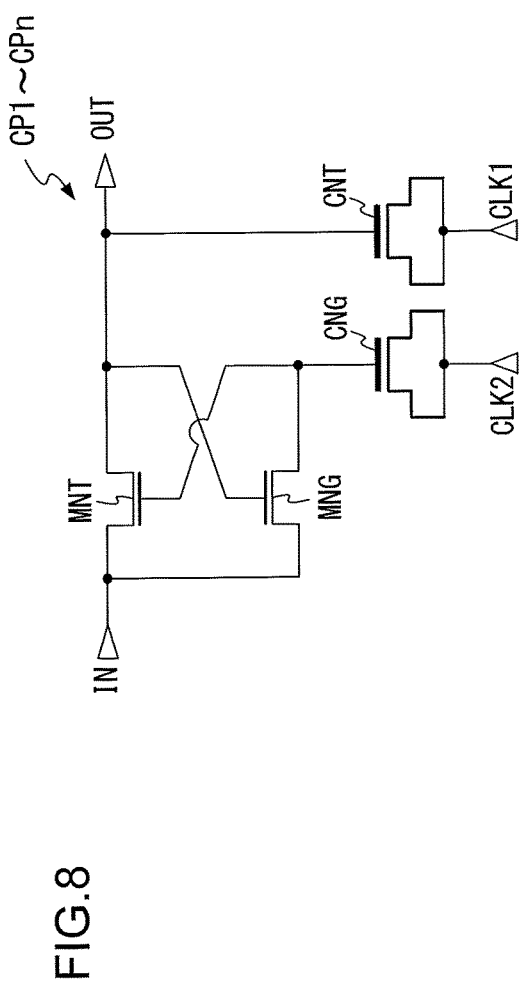
FIG. 8 is a circuit diagram showing a circuit configuration of each charge pump circuit CP1 to CPn.

FIG. 8 is a circuit diagram showing a circuit configuration of each of the charge pump circuits CP1 to CPn. The charge pump circuits CP1 to CPn each include an input node IN, an output node OUT, a first clock input terminal CLK1, a second clock input terminal CLK2, n-channel MOS transistors MNT and MNG, and capacitors CNG and CNT.

The transistor MNT serves as a transfer gate. The source terminal of the transistor MNT is connected to the input node IN, and the drain terminal thereof is connected to the output terminal OUT. The gate terminal of the transistor MNT serves as a control terminal, and is connected with the drain terminal of the transistor MNG which serves as an auxiliary transfer gate. The source terminal of the transistor MNG is connected to the input node IN, and the gate terminal thereof is connected to the output node OUT.

The capacitor CNT is formed by interconnecting the source and drain terminals of an n-channel MOS transistor. The connection node between the source and drain terminals serves as one terminal of the capacitor CNT. The gate terminal of the transistor serves as the other terminal of the capacitor CNT. In the circuit shown in FIG. 8, the capacitor CNT functions as a charge pumping capacitor of which one terminal is connected to the first clock input terminal CLK1 and the other terminal is connected to the output node OUT.

The capacitor CNG is formed by interconnecting the source and drain terminals of an n-channel MOS transistor. The connection node between the source and drain terminals serves as one terminal of the capacitor. The gate terminal of the transistor serves as the other terminal of the capacitor. In the circuit shown in FIG. 8, the capacitor CNG is a gate charging capacitor of which one terminal is connected to the second clock input terminal CLK2 and the other terminal is connected to the gate terminal of the transistor MNT.

In the charge pump circuit CP shown in FIG. 8, the capacitor CNT serving as a first capacitor accumulates a charge on the output node OUT according to the capacitor clock signal CK1 or CK2 serving as a first clock signal, supplied to the first clock input terminal CLK1. The voltage of the output terminal OUT is thereby boosted. In the charge pump circuit CP, the capacitor CNG serving as a second capacitor accumulates a charge on the gate terminal of the transistor MNT according to the gate clock signal CK1A or CK2A serving as a second clock signal, supplied to the second clock input terminal CLK2. The voltage of the gate terminal is thereby boosted. The transistor MNG serving as the auxiliary transfer gate superposes the voltage of the input node IN on the gate terminal of the transistor MNT according to the voltage of the output node OUT. If the voltage of the gate terminal of the transistor MNT exceeds a threshold voltage, the transistor MNT serving as the transfer gate turns on to apply the voltage of the input node IN to the output node OUT.

In the charge pump unit 10 shown in FIG. 7, the power supply voltage VCC is applied to the input node IN of the first charge pump circuit CP1 among the charge pump circuits CP1 to CPn connected in series. The output node OUT of the charge pump circuit CP1 is connected to the input node IN of the charge pump circuit CP2 at the next stage. The output node OUT of the charge pump circuit CP(k−1) is connected to the input node IN of the charge pump circuit CPk (k is an integer of 3 to n). The power supply line LL is connected to the output node OUT of the last charge pump circuit CPn among the charge pump circuits CP1 to CPn. The voltage of the output node OUT of the charge pump circuit CPn is output as the foregoing boosted voltage VEP to the internal circuit through the power supply line LL.

In the charge pump unit 10, the capacitor clock signal CK2 shown in (a) of FIG. 3 is supplied to the first clock input terminal CLK1 of each of the odd-numbered charge pump circuits CP among the charge pump circuits CP1 to CPn. The gate clock signal CK1A shown in (b) or (c) of FIG. 3 is supplied to the second clock input terminal CLK2 of each of the odd-numbered charge pump circuits CP. The capacitor clock signal CK1 shown in (a) of FIG. 3 is supplied to the first clock input terminal CLK1 of each of the even-numbered charge pump circuits CP among the charge pump circuits CP1 to CPn connected in series. The gate clock signal CK2A shown in (b) or (c) of FIG. 3 is supplied to the second clock input terminal CLK2 of each of the even-numbered charge pump circuits CP.

With the configuration shown in FIG. 7, in the charge pump unit 10, the odd-numbered charge pump circuits CP accumulate charges on their own output nodes OUT according to the capacitor clock signal CK2. The even-numbered charge pump circuits CP take in and apply the voltages corresponding to the accumulated charges to their own output nodes OUT in a period when the gate clock signal CK2A shows logic level 1. In the charge pump unit 10, the even-numbered charge pump circuits CP further accumulate charges on their own output nodes OUT according to the capacitor clock signal CK1. The odd-numbered charge pump circuits CP take in and apply the voltages corresponding to the accumulated charges to their own output nodes OUT in a period when the gate clock signal CK1A shows logic level 1.

Such operations are repeated by each of the charge pump circuits CP1 to CPn, whereby the voltage value of the power supply voltage VCC supplied to the charge pump circuit CP1 increases gradually through the charge pump circuits CP1 to CPn. Specifically, the voltage value of the output node OUT of the charge pump circuit CP1 becomes a first voltage higher than the power supply voltage VCC. The first voltage is taken into the charge pump circuit CP2 at the next stage, of which the voltage value of the output node OUT becomes a second voltage higher than the first voltage. The second voltage is taken into the charge pump circuit CP3 at the next stage, of which the voltage value of the output node OUT becomes a third voltage higher than the second voltage. In such a manner, among the charge pump circuits CP1 to CPn connected in series, charge pump circuits CP at latter stages have higher voltages at their output nodes OUT. The highest voltage appears at the output node OUT of the last charge pump circuit CPn among the charge pump circuits CP1 to CPn. The charge pump unit 10 thus applies the voltage of the output node OUT of the charge pump circuit CPn as the boosted voltage VEP to the power supply line LL.

In summary, the charge pump unit 10 is activated to perform so-called charge pumping of gradually boosting the voltage of the power supply voltage VCC during a period in which the capacitor clock signals CK1 and CK2 and the gate clock signals CK1A and CK2A are supplied from the boosting clock signal generation circuit 27 and the voltage switch circuit 28. The charge pump unit 10 then supplies the resulting boosted voltage VEP to the power supply line LL. While the supply of the clock signals (CK1, CK2, CK1A, and CK2A) stops, the charge pump unit 10 is deactivated and does not perform the foregoing charge pumping. During such a period, the voltage value of the boosted voltage VEP decreases gradually.

Next, an operation of the booster circuit 100 having the configuration shown in FIG. 1 will be described with reference to the timing chart shown in FIG. 2.

As shown in FIG. 2, immediately after the boosting mode signal PRG transitions from logic level 0 to logic level 1, the boosted voltage VEP has a voltage value lower than or equal to the target voltage VT. In such a period, the boosting clock signal generation circuit 27 and the voltage switch circuit 28 supply the clock signals (CK1, CK2, CK1A, and CK2A) to the charge pump unit 10. The charge pump unit 10 then starts charge pumping. As shown in FIG. 2, the voltage value of the boosted voltage VEP increases gradually and reaches the target voltage VT (initial charge pump period IG). After such an initial charge pump period IG, a boosting control of alternating a stop and execution of the charge pumping is performed on the charge pump unit 10 in the following manner.

If the boosted voltage VEP exceeds the target voltage VT, the boosting clock signal generation circuit 27 and the voltage switch circuit 28 stop supplying the clock signals (CK1, CK2, CK1A, and CK2A) and the charge pump unit 10 stops charge pumping (charge pump stop period STP). While the charge pumping is stopped, as shown in FIG. 2, the voltage value of the boosted voltage VEP decreases gradually and comes to the target voltage VT again. If the boosted voltage VEP becomes lower than or equal to the target voltage VT, the boosting clock signal generation circuit 27 and the voltage switch circuit 28 start to supply the clock signals (CK1, CK2, CK1A, and CK2A) to the charge pump unit 10. The charge pump unit 10 then starts charge pumping. As shown in FIG. 2, the voltage value of the boosted voltage VEP increases gradually to reach the target voltage VT (charge pump execution period GO).

After the initial charge pump period IG, the charge pump stop period STP and the charge pump execution period GO are alternated as shown in FIG. 2. The voltage value of the boosted voltage VEP is thereby maintained at voltage values near the target voltage VT as shown in FIG. 2.

If the boosting control period signal CPHV transitions from logic level 0 to logic level 1 as shown in FIG. 2, the duty monitoring circuit 25 initially determines the ratio of the period in which the target voltage achievement signal SAO has logic level 1 in each monitoring period MS, i.e., the ratio of the charge pump stop period.

If a load current of the internal circuit supplied with the boosted voltage VEP increases, the voltage value of the boosted voltage VEP may drop significantly, for example, as in the monitoring period M2 shown in FIG. 2. In such a case, the charge pump stop period (i.e., period in which the target voltage achievement signal SAO has logic level 1) decreases and the charge pump execution period increases accordingly. The charge pump execution period also increases if the transfer gate (MNT) of each charge pump circuit CP1 to CPn has a threshold voltage higher than a desired value due to manufacturing variations.

If the ratio of the charge pump stop period in the monitoring period MS is smaller than or equal to the first threshold TH1, as shown in FIG. 2, the duty monitoring circuit 25 of the booster circuit 100 switches the voltage switch signal BST from the state of logic level 0 to logic level 1. The voltage switch circuit 28 then switches the pulse voltage value of the gate clock signals CK1A and CK2A supplied to the gate terminals of the transfer gates (MNT) in the respective charge pump circuits CP1 to CPn from the pulse voltage value a1 shown in (b) of FIG. 3 to the pulse voltage value a2 shown in (c) of FIG. 3.

Here, the gate terminals of the transistors MNT of the charge pump circuits CP1 to CPn are driven by the boosted power supply voltage VBST which is higher than the power supply voltage VCC. This lowers the ON resistances of the transistors MNT of the charge pump circuits CP1 to CPn. The current driving capability of the booster circuit 100 increases, and the charge pump execution period can be reduced accordingly. Since the transistors MNT are MOS transistors, their gate terminals have relatively high impedance. The amount of power consumption reduced by the reduction of the charge pump execution period is therefore greater than the amount of power consumption increased by the increase of the voltage value of the gate clock signals (CK1A and CK2A). The power consumption can thus be reduced.

If the load current of the internal circuit supplied with the boosted voltage VEP becomes small, the boosting speed of the boosted voltage VEP may increase to cause ringing of large amplitude, for example, as in the monitoring period M4 shown in FIG. 2. The boosting speed of the boosted voltage VEP can also increase to cause ringing of large amplitude if the transfer gates (MNT) of the charge pump circuits CP1 to CPn have a threshold voltage lower than a desired value due to manufacturing variations. If the ratio of the charge pump stop period in the monitoring period MS is greater than or equal to the second threshold TH2, the duty monitoring circuit 25 of the booster circuit 100 switches the voltage switch signal BST from the state of logic level 1 to logic level 0 as shown in FIG. 2. The voltage switch circuit 28 then switches the pulse voltage value of the gate clock signals CK1A and CK2A supplied to the gate terminals of the transfer gates (MNT) in the charge pump circuits CP1 to CPn from the pulse voltage value a2 shown in (c) of FIG. 3 to the pulse voltage value a1 shown in (b) of FIG. 3.

Here, the gate terminals of the transistors MNT of the charge pump circuits CP1 to CPn are driven by the power supply voltage VCC having a voltage value lower than that of the boosted power supply voltage VBS. This increases the ON resistances of the transistors MNT of the charge pump circuits CP1 to CPn, and the boosting speed by the charge pumping decreases accordingly. The amount of ringing occurring in the boosted voltage VEP can thus be suppressed.

Figure 9:
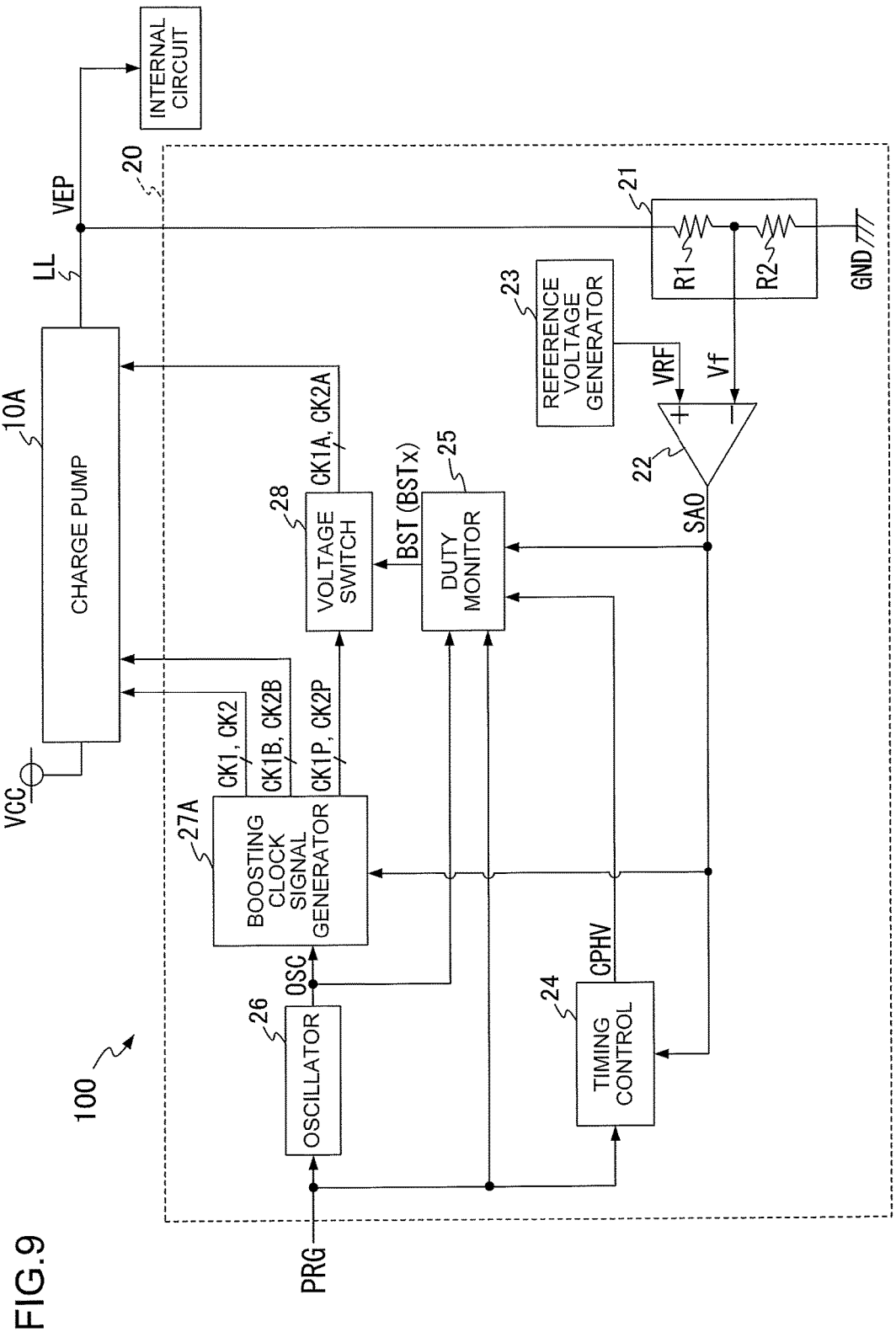
FIG. 9 is a block diagram showing another configuration of the booster circuit 100 according to the present invention.

FIG. 9 is a block diagram showing another configuration of the booster circuit 100 according to the present invention. The configuration shown in FIG. 9 is the same as that shown in FIG. 1 except that a boosting clock signal generation circuit 27A is used instead of the boosting clock signal generation circuit 27, and a charge pump unit 10A is used instead of the charge pump unit 10.

Figure 10:
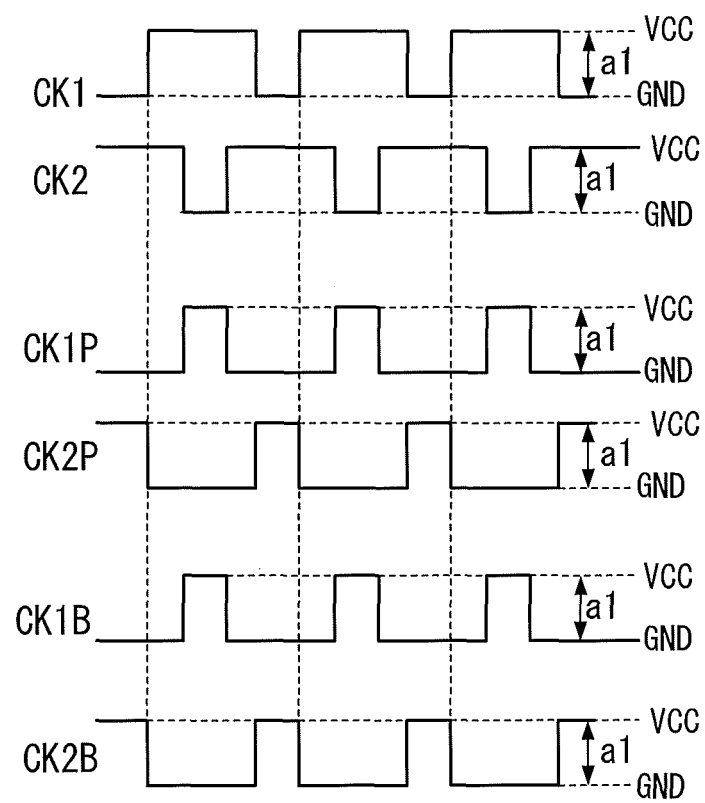
FIG. 10 is a waveform chart showing examples of waveforms of the capacitor clock signals CK1 and CK2 and gate clock signals CK1P, CK2P, CK1B, and CK2B.

In FIG. 9, the boosting clock signal generation circuit 27A generates capacitor clock signals CK1 and CK2 and gate clock signals CK1P, and CK2P, CK1B, and CK2B shown in FIG. 10 on the basis of the reference clock signal OSC. The boosting clock signal generation circuit 27A generates such signals only during a period in which the target voltage achievement signal SAO having logic level 0, indicating that the boosted voltage VEP is lower than or equal to the target voltage VT, is supplied. The capacitor clock signals CK1 and CK2 and the gate clock signals CK1P and CK2P have the same waveforms as those shown in FIG. 3. The gate clock signals CK1P and CK1B have the same waveforms. The gate clock signals CK2P and CK2B have the same waveforms.

Like the boosting clock signal generation circuit 27, the boosting clock signal generation circuit 27A supplies the capacitor clock signals CK1 and CK2 to the charge pump unit 10A, and supplies the gate clock signals CK1P and CK2P to the voltage switch circuit 28. The boosting clock signal generation circuit 27A further supplies the gate clock signals CK1B and CK2B shown in FIG. 10 to the charge pump unit 10A.

Figure 11:
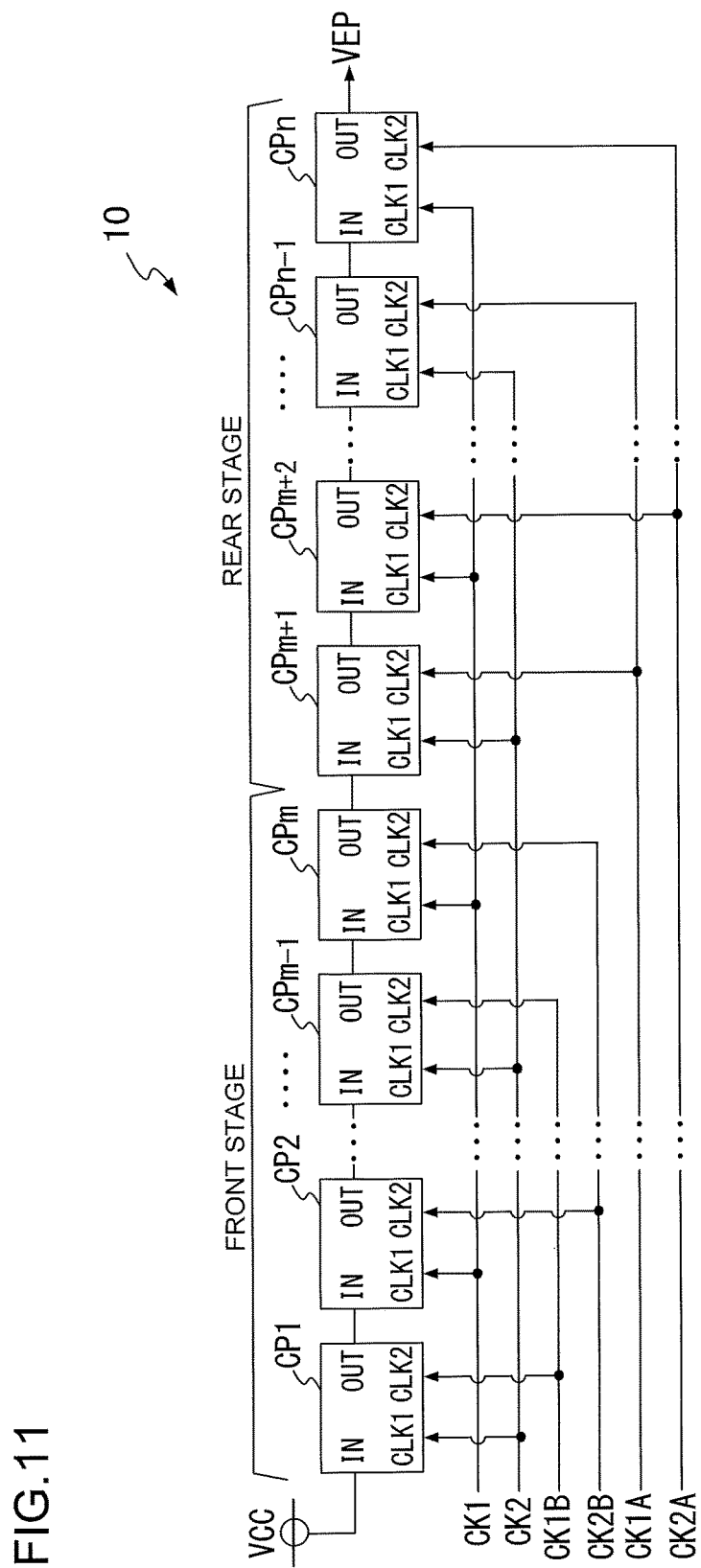
FIG. 11 is a block diagram showing an example of an internal configuration of a charge pump unit 10A.

FIG. 11 is a block diagram showing an example of an internal configuration of the charge pump unit 10A. As shown in FIG. 11, the charge pump unit 10A includes n charge pump circuits CP1 to CPn connected in series like the charge pump unit 10. Like those shown in FIG. 7, the charge pump circuits CP1 to CPn each include the internal configuration shown in FIG. 8.

The power supply voltage VCC is applied to the input node IN of the first charge pump circuit CP1 among the charge pump circuits CP1 to CPn connected in series. The output node OUT of the charge pump circuit CP1 is connected to the input node IN of the charge pump circuit CP2 at the next stage. The output node OUT of the charge pump circuit CP(k−1) is connected to the input node IN of the charge pump circuit CPk (k is an integer of 3 to n). The voltage of the output node OUT of the last charge pump circuit CPn among the charge pump circuits CP1 to CPn is output as the boosted voltage VEP.

In the charge pump unit 10A, like the charge pump unit 10, the capacitor clock signal CK1 is supplied to the first clock input terminal CLK1 of each of the even-numbered charge pump circuits CP among the charge pump circuits CP1 to CPn. Like the charge pump unit 10, the capacitor clock signal CK2 is supplied to the first clock input terminal CLK1 of each of the odd-numbered charge pump circuits CP among the charge pump circuits CP1 to CPn.

In the charge pump unit 10A, the charge pump circuits CP1 to CPn are divided between front-stage charge pump circuits CP1 to CPm (m is an integer greater than or equal to 2 and smaller than n) and rear-stage charge pump circuits CP(m+1) to CPn. The gate clock signals CK1A, CK2A, CK1B, and CK2B are supplied to the second clock input terminals CLK2 of the charge pump circuits CP in the following manner.

The gate clock signal CK1B is supplied to the second clock input terminal CLK2 of each of the odd-numbered charge pump circuits CP among the front-stage charge pump circuits CP1 to CPm. The gate clock signal CK2B is supplied to the second clock input terminal CLK2 of each of the even-numbered charge pump circuits CP among the charge pump circuits CP1 to CPm.

The gate clock signal CK1A is supplied to the second clock input terminal CLK2 of each of the odd-numbered charge pump circuits CP among the rear-stage charge pump circuits CP(m+1) to CPn. The gate clock signal CK2A is applied to the second clock input terminal CLK2 of each of the even-numbered charge pump circuits CP among the charge pump circuits CP(m+1) to CPn.

Depending on the voltage switch signal BST, the voltage values of the gate clock signals CK1A and CK2A are increased from the pulse voltage value a1 to the pulse voltage value a2 greater than the pulse voltage value a1. The voltage values of the gate clock signals CK1B and CK2B are fixed to the pulse voltage value a1. That is, the charge pump unit 10A is configured so that the gate clock signals with the increased pulse voltage values (CK1A and CK2A) are supplied to only the rear-stage charge pump circuits CP(m+1) to CPn among the charge pump circuits CP1 to CPn. With the charge pump circuits CP1 to CPn connected in series, the body effect on the rear-stage charge pump circuits CP is higher than that on the front-stage ones. The voltages occurring on the output nodes OUT of the rear-stage charge pump circuits CP are higher and more difficult for the transfer gates (MNT) to take in.

The charge pump unit 10A then supplies the gate clock signals (CK1A and CK2A) capable of voltage switching to only the group of rear-stage charge pump circuits among the charge pump circuits CP1 to CPn connected in series. The same effects as those of the configuration shown in FIG. 1 are thereby obtained with a further reduction in power. In the embodiment shown in FIG. 2, the duty monitoring circuit 25 supplies the voltage switch signal BST having logic level 0, which specifies the pulse voltage value al, to the voltage switch circuit 28 during the initial charge pump period IG.

Figure 12:
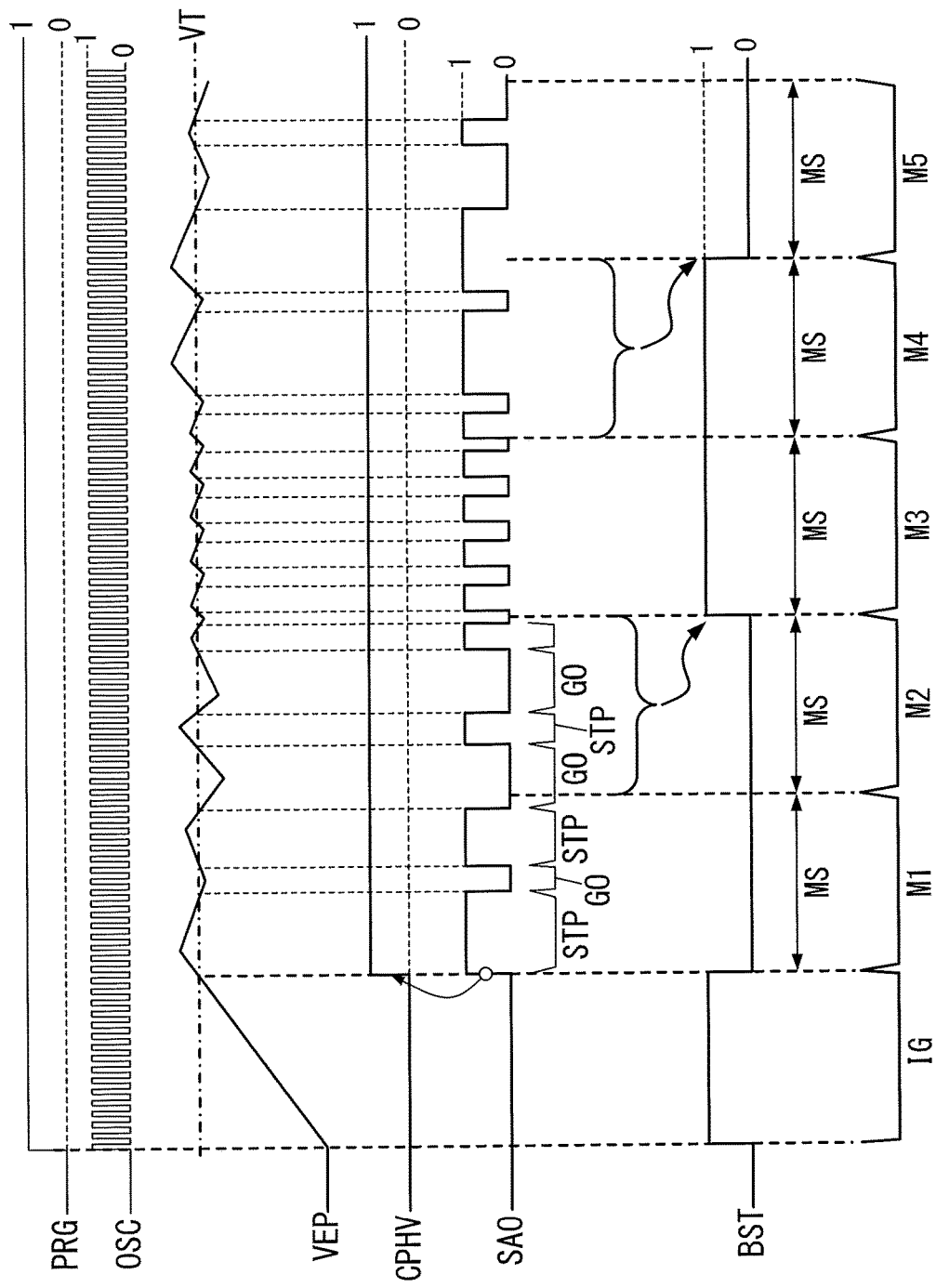
FIG. 12 is a timing chart showing another example of the internal operation of the booster circuit 100.
Figure 13:
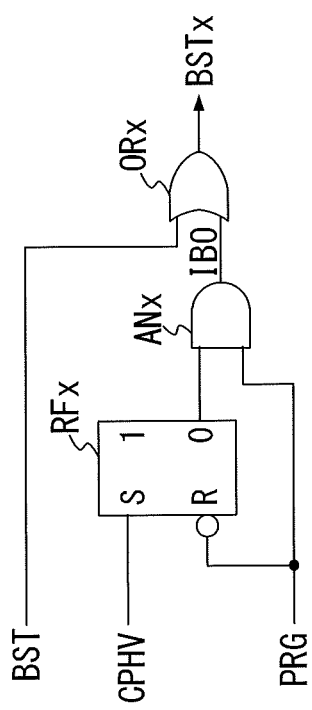
FIG. 13 is a circuit diagram showing an example of a BST output circuit included in the duty monitoring circuit 25.

However, as shown in FIG. 12, the duty monitoring circuit 25 may supply the voltage switch circuit 28 with the voltage switch signal BST having logic level 1 during the initial charge pump period IG. More specifically, during the initial charge pump period IG, the voltage switch signal BST having logic level 1, which specifies the pulse voltage value a2 greater than the pulse voltage value a1 as the gate voltage values of the gate clock signals (CK1A and CK2A), is forcefully supplied to the voltage switch circuit 28. For that purpose, the duty monitoring circuit 25 includes a BST output circuit shown in FIG. 13, for example. The BST output circuit shown in FIG. 13 includes an RS flip-flop RFx, an AND gate ANx, and an OR gate ORx. The boosting control period signal CPHV is supplied to the set terminal S of the RS flip-flop RFx. The boosting mode signal PRG is supplied to the inverting reset terminal R. The AND gate ANx supplies an initial voltage switch signal IBO having logic level 1 to the OR gate ORx if the signal of the inverting output terminal of the RS flip-flop RFx shows logic level 1 and the boosting mode signal PRG has logic level 1. The AND gate ANx supplies the initial voltage switch signal IBO having logic level 0 to the OR gate ORx if the signal of the inverting output terminal of the RS flip-flop RFx shows logic level 0 or if the boosting mode signal PRG has logic level 0. The OR gate ORx supplies the voltage switch signal BST or the initial voltage switch signal IBO as a voltage switch signal BSTx to the voltage switch circuit 28.

With such a configuration, the voltage rising time of the boosted voltage VEP can be reduced without increasing the area occupied by the charge pump circuits CP1 to CPn in the semiconductor chip.

According to the operation shown in FIG. 12, the voltage switch signal BST having logic level 1 is supplied to the voltage switch circuit 28 throughout the initial charge pump period IG. However, the voltage switch signal BST having logic level 1 does not necessarily need to be supplied to the voltage switch circuit 28 throughout the initial charge pump period IG.

Figure 14:
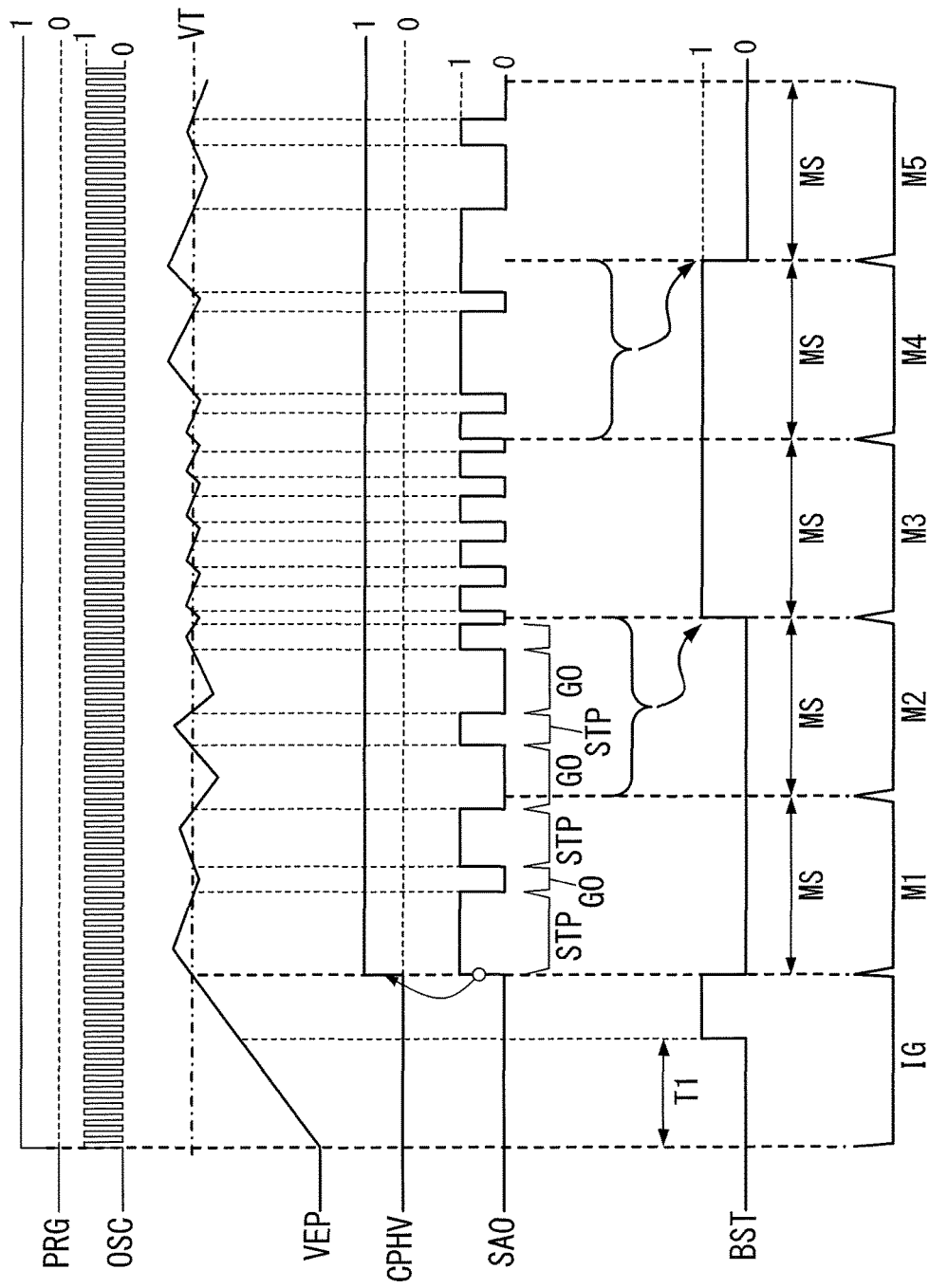
FIG. 14 is a timing chart showing another example of the internal operation of the booster circuit 100.

For example, suppose that as shown in FIG. 14, the boosted voltage VEP is lower than or equal to the target voltage VT when a predetermined period T1 elapses from the transition of the boosting mode signal PRG from logic level 0 to the state of logic level 1. In such a case, the voltage switch signal BST having logic level 1 is supplied to the voltage switch circuit 28 during a period between when the predetermined period T1 elapses and when the boosting control period signal CPHV rises. For that purpose, the duty monitoring circuit 25 includes a timer and a voltage switch pulse generation unit. The timer measures time elapsed since the transition of the boosting mode signal PRG from logic level 0 to the state of logic level 1. The voltage switch pulse generation unit determines whether the elapsed time measured by the timer coincides with the predetermined period T1. If the elapsed time is determined to coincide with the predetermined period T1, the voltage switch pulse generation unit determines whether the the boosted voltage VEP is higher than the target voltage VT. If the boosted voltage VEP is determined to be lower than or equal to the target voltage VT, the voltage switch pulse generation unit supplies a pulse signal as the voltage switch signal BST to the voltage switch circuit 28. The pulse signal maintains the state of logic level 1 during a period from then until the boosting control period signal CPHV rises. If the boosted voltage VEP is higher than the target voltage VT when the predetermined period T1 elapses since the transition of the boosting mode signal PRG from logic level 0 to the state of logic level 1, the voltage switch pulse generation unit does not generate the foregoing pulse signal. That is, in such a case, the duty monitoring circuit 25 supplies the voltage switch signal BST having logic level 0 to the voltage switch circuit 28 as shown in FIG. 2 throughout the initial charge pump period IG.

With such a configuration, the power consumption can be reduced as compared to when the gate clock signals (CK1A and CK2A) having the high voltage (pulse voltage value a2) are generated throughout the initial charge pump period IG as shown in FIG. 12. This also reduces the period in which the gate clock signals (CK1A and CK2A) having the high voltage (pulse voltage value a2) are supplied to the control terminals (gate terminals) of the transfer gates (MNT) of the charge pump circuits (CP1 to CPn) during the initial charge pump period IG. The amount of ringing occurring in the boosted voltage VEP can thus be reduced.

While the charge pump unit 10 or 10A of the booster circuit 100 according to the foregoing embodiment includes n charge pump circuits CP1 to CPn connected in series, the number of charge pump circuits CP may be one.

In the block diagram shown in FIG. 1 or 9, the duty monitoring circuit 25 and the voltage switch circuit 28 are shown as separate blocks. However, the duty monitoring circuit 25 and the voltage switch circuit 28 may be integrated into a single block as a clock voltage adjustment unit.

In summary, the booster circuit 100 may include a charge pump unit (CP) that boosts an input voltage applied to an input node (IN) to generate a boosted voltage (VEP) on an output node (OUT), and a control unit (20) that controls the charge pump unit. The charge pump unit includes a capacitor (CNT) that accumulates a charge on the output node according to a first clock signal (CK1 or CK2), and a transfer gate (MNT) that takes in and applies the voltage of the input node to the output node according to a second clock signal (CK1A or CK2A) received at a control terminal (gate terminal). The control unit includes a clock voltage adjustment unit (25 and 28). The clock voltage adjustment unit increases a pulse voltage value of the second clock signal if a ratio of a total time of periods in which the boosted voltage is higher than a target voltage in a predetermined monitoring period (MS) is smaller than or equal to a first threshold (TH1).

This application is based on a Japanese Patent Application No. 2016-90372 which is hereby incorporated by reference.

What is claimed is:

1. A booster circuit comprising:
a charge pump unit for boosting an input voltage applied to an input node to generate a boosted voltage and outputting the boosted voltage to an output node; and
a control unit for controlling operation of the charge pump unit, wherein
the charge pump unit includes
a capacitor for accumulating a charge on the output node in accordance with a pulse voltage of a first clock signal, and
a transfer gate for taking in a voltage of the input node and for applying the taken-in voltage to the output node, in accordance with a pulse voltage of a second clock signal received at a control terminal, and
the control unit includes a clock voltage adjustment unit for increasing a value of the pulse voltage of the second clock signal if a ratio of a total time of periods in which the boosted voltage is higher than a target voltage in a predetermined monitoring period is smaller than or equal to a first threshold, and for reducing the value of the pulse voltage of the second clock signal if the ratio of the total time in the monitoring period is greater than or equal to a second threshold greater than the first threshold.

2. The booster circuit according to claim 1, wherein the clock voltage adjustment unit, if the ratio of the total time in the monitoring period is smaller than or equal to the first threshold, switches the pulse voltage value of the second clock signal from a first pulse voltage value to a second pulse voltage value higher than the first pulse voltage value, and if the ratio of the total time in the monitoring period is greater than or equal to the second threshold, switches the pulse voltage value of the second clock signal from the second pulse voltage value to the first pulse voltage value.

3. The booster circuit according to claim 2, wherein the control unit includes a clock generation circuit for generating the first and second clock signals, the clock generation circuit being configured, if the boosted voltage is lower than or equal to the target voltage, to supply the first and second clock signals to the charge pump unit, and if the boosted voltage is higher than the target voltage, to stop supplying the first and second clock signals to the charge pump unit.

4. The booster circuit according to claim 3, wherein the clock generation circuit generates first and second gate clock signals, and is configured, if the boosted voltage is lower than or equal to the target voltage, to supply the first and second gate clock signals to the clock voltage adjustment unit, and if the boosted voltage is higher than the target voltage, to stop supplying the first and second gate clock signals to the clock voltage adjustment unit.

5. The booster circuit according to claim 4, wherein the clock generation circuit receives a boosting mode signal for prompting deactivation or activation, and is configured to stop generating the first and second clock signals while the boosting mode signal is in a state of prompting the deactivation, and to start to generate the first and second clock signals if the boosting mode signal transitions from the state of prompting the deactivation to a state of prompting the activation.

6. The booster circuit according to claim 5, wherein the clock voltage adjustment unit sets the pulse voltage value of the second clock signal at the first pulse voltage value when the boosting mode signal transitions from the state of prompting the deactivation to the state of prompting the activation.

7. The booster circuit according to claim 5, wherein the clock voltage adjustment unit sets the pulse voltage value of the second clock signal at the second pulse voltage value during a period between when the boosting mode signal transitions from the state of prompting the deactivation to the state of prompting the activation and when the boosted voltage exceeds the target voltage.

8. The booster circuit according to claim 5, wherein the clock voltage adjustment unit sets the pulse voltage value of the second clock signal at the first pulse voltage value until a predetermined period elapses from when the boosting mode signal transitions from the state of prompting the deactivation to the state of prompting the activation, and if the boosted voltage is lower than or equal to the target voltage when the predetermined period elapses, sets the pulse voltage value of the second clock signal at the second pulse voltage value until the boosted voltage exceeds the target voltage.

9. A booster circuit comprising:
a charge pump unit that includes first to n-th (n is an integer greater than or equal to 2) charge pump circuits connected in series, the charge pump circuits each including an input node and an output node and boosting an input voltage applied to the input node to generate a boosted voltage on the output node; and
a control unit for controlling operation of the charge pump unit, wherein
the first to n-th charge pump circuits each include
a capacitor for accumulating a charge on the output node in accordance with a pulse voltage of a first clock signal, and
a transfer gate for taking in the input voltage applied to the input node and for applying the taken-in voltage to the output node, in accordance with a pulse voltage of a second clock signal received at a gate terminal, and
the control unit includes a clock voltage adjustment unit for increasing a value of the pulse voltage of the second clock signal if a ratio of a total time of periods in which the boosted voltage on the output node of the n-th charge pump circuit is higher than a target voltage in a predetermined monitoring period is smaller than or equal to a first threshold, and for reducing the value of the pulse voltage of the second clock signal if the ratio of the total time in the monitoring period is greater than or equal to a second threshold greater than the first threshold.

10. The booster circuit according to claim 9, wherein the clock voltage adjustment unit, if the ratio of the total time in the monitoring period is smaller than or equal to the first threshold, switches the pulse voltage value of the second clock signal from a first pulse voltage value to a second pulse voltage value higher than the first pulse voltage value, and if the ratio of the total time in the monitoring period is greater than or equal to the second threshold, switches the pulse voltage value of the second clock signal from the second pulse voltage value to the first pulse voltage value.

11. The booster circuit according to claim 10, wherein
a power supply voltage is applied to the input node of the first charge pump circuit,
a power supply line is connected to the output node of the n-th charge pump circuit,
the second clock signal is supplied to first to m-th (m is an integer greater than or equal to 2 and smaller than n) front-stage charge pump circuits among the first to n-th charge pump circuits, and to (m+1)th to n-th rear-stage charge pump circuits among the first to n-th charge pump circuits, and
the clock voltage adjustment unit does not switch the pulse voltage value of the second clock signal that is supplied to the first to m-th (m is an integer greater than or equal to 2 and smaller than n) front-stage charge pump circuits among the first to n-th charge pump circuits, and switches the pulse voltage value of the second clock signal that is supplied to the (m+1)th to n-th rear-stage charge pump circuits among the first to n-th charge pump circuits from the first pulse voltage value to the second pulse voltage value or from the second pulse voltage value to the first pulse voltage value.

12. The booster circuit according to claim 9, wherein the control unit includes a clock generation circuit for generating the first and second clock signals, the clock generation circuit being configured, if the boosted voltage on the output node of the n-th charge pump circuit is lower than or equal to the target voltage, to supply the first and the second clock signals to each of the first to n-th charge pump circuits, and if the boosted voltage on the output node of the n-th charge pump circuit is higher than the target voltage, to stop supplying the first and the second clock signals to each of the first to n-th charge pump circuits.

13. The booster circuit according to claim 12, wherein the clock generation circuit generates first and second gate clock signals, and is configured, if the boosted voltage on the output node of the n-th charge pump circuit is lower than or equal to the target voltage, to supply the first and second gate clock signals to the clock voltage adjustment unit, and if the boosted voltage on the output node of the n-th charge pump circuit is higher than the target voltage, to stop supplying the first and second gate clock signals to the clock voltage adjustment unit.

* * * * *